(12) United States Patent
Shen et al.

(10) Patent No.: US 11,457,532 B2
(45) Date of Patent: Sep. 27, 2022

(54) METHOD OF MANUFACTURING CIRCUIT BOARD

(71) Applicants: QING DING PRECISION ELECTRONICS (HUAIAN) CO., LTD, Huai an (CN); Avary Holding (Shenzhen) Co., Limited., Shenzhen (CN)

(72) Inventors: Fu-Yun Shen, Shenzhen (CN); Ming-Jaan Ho, New Taipei (TW); Hsiao-Ting Hsu, New Taipei (TW); Lin-Jie Gao, Shenzhen (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 709 days.

(21) Appl. No.: 16/225,352

(22) Filed: Dec. 19, 2018

(65) Prior Publication Data

US 2020/0137894 A1  Apr. 30, 2020

(30) Foreign Application Priority Data

Oct. 30, 2018  (CN) .......................... 201811281101.5

(51) Int. Cl.
 *H05K 3/46* (2006.01)
 *H05K 3/00* (2006.01)
 *H05K 1/02* (2006.01)

(52) U.S. Cl.
 CPC ......... *H05K 3/4623* (2013.01); *H05K 1/0218* (2013.01); *H05K 3/0094* (2013.01);
 (Continued)

(58) Field of Classification Search
 CPC .... H05K 3/4611; H05K 3/462; H05K 3/4623; H05K 1/0218; H05K 2201/096; H05K 1/0219; Y10T 29/49126
 See application file for complete search history.

(56) References Cited

U.S. PATENT DOCUMENTS 9,155,189 B1 * 10/2015 Chen .................... H05K 1/0219
2005/0057908 A1   3/2005 Egitto et al.
(Continued)

FOREIGN PATENT DOCUMENTS

CN     101299911 A     11/2008
JP      04028292 A  *  1/1992
(Continued)

OTHER PUBLICATIONS

G. Matijasevic, C. Gallagher and P. Gandhi, "High density multilayer substrates using patterned microvia interposers," 1998 IEEE Aerospace Conference Proceedings (Cat. No. 98TH8339), 1998, pp. 393-398 vol. 1, doi: 10.1109/AERO.1998.686936. (Year: 1998).*

*Primary Examiner* — A. Dexter Tugbang
(74) *Attorney, Agent, or Firm* — ScienBiziP, P.C.

(57) ABSTRACT

A method for manufacturing a circuit board comprises steps of providing a single-sided board comprising a first insulating base, a copper layer, and at least one first conductive structure; providing a laminated board comprising a metal layer, a third insulating base, a metal shielding layer, and a second insulating base; forming a wiring layer by the metal layer comprising at least one signal wire and at least one connecting pad; defining at least one second through hole each passing through the second insulating base, the metal shielding layer, and the third insulating base; forming a second conductive structure in each second through hole; providing a double-sided board comprising a wiring layer, a fourth insulating base, a first copper foil; and at least one third conductive structure; pressing the single-sided board,
(Continued)

at least one middle structure, and the double-sided board in that sequence to form the circuit board.

7 Claims, 11 Drawing Sheets

(52) U.S. Cl.
CPC ......... *H05K 3/4617* (2013.01); *H05K 3/4661* (2013.01); *H05K 3/462* (2013.01); *H05K 3/4611* (2013.01); *H05K 2201/096* (2013.01); *Y10T 29/49126* (2015.01)

(56) References Cited

U.S. PATENT DOCUMENTS

| | | | | |
|---|---|---|---|---|
| 2007/0199195 | A1* | 8/2007 | Davis | H05K 3/4623 |
| | | | | 29/830 |
| 2007/0273047 | A1 | 11/2007 | Nakai et al. | |
| 2008/0168652 | A1* | 7/2008 | Koyama | H05K 3/462 |
| | | | | 29/830 |

FOREIGN PATENT DOCUMENTS

| | | |
|---|---|---|
| TW | 200407056 A | 5/2004 |
| TW | 200642534 A | 12/2006 |

* cited by examiner

METHOD OF MANUFACTURING CIRCUIT BOARD

FIELD

The subject matter herein generally relates to a circuit board, especially relates to a method of manufacturing a circuit board.

BACKGROUND

Signals transmitted by the signal wires of the circuit board are susceptible to electromagnetic interference. At present, at least one shielding layer is pressed on the wiring layer and connects the wiring layer to protect signals transmitted from electromagnetic interference. However, the above described method requires processes with high accuracy Therefore, there is room for improvement within the art.

BRIEF DESCRIPTION OF THE DRAWINGS

Implementations of the present disclosure will now be described, by way of embodiments only, with reference to the attached figures.

DETAILED DESCRIPTION

Figure 1:
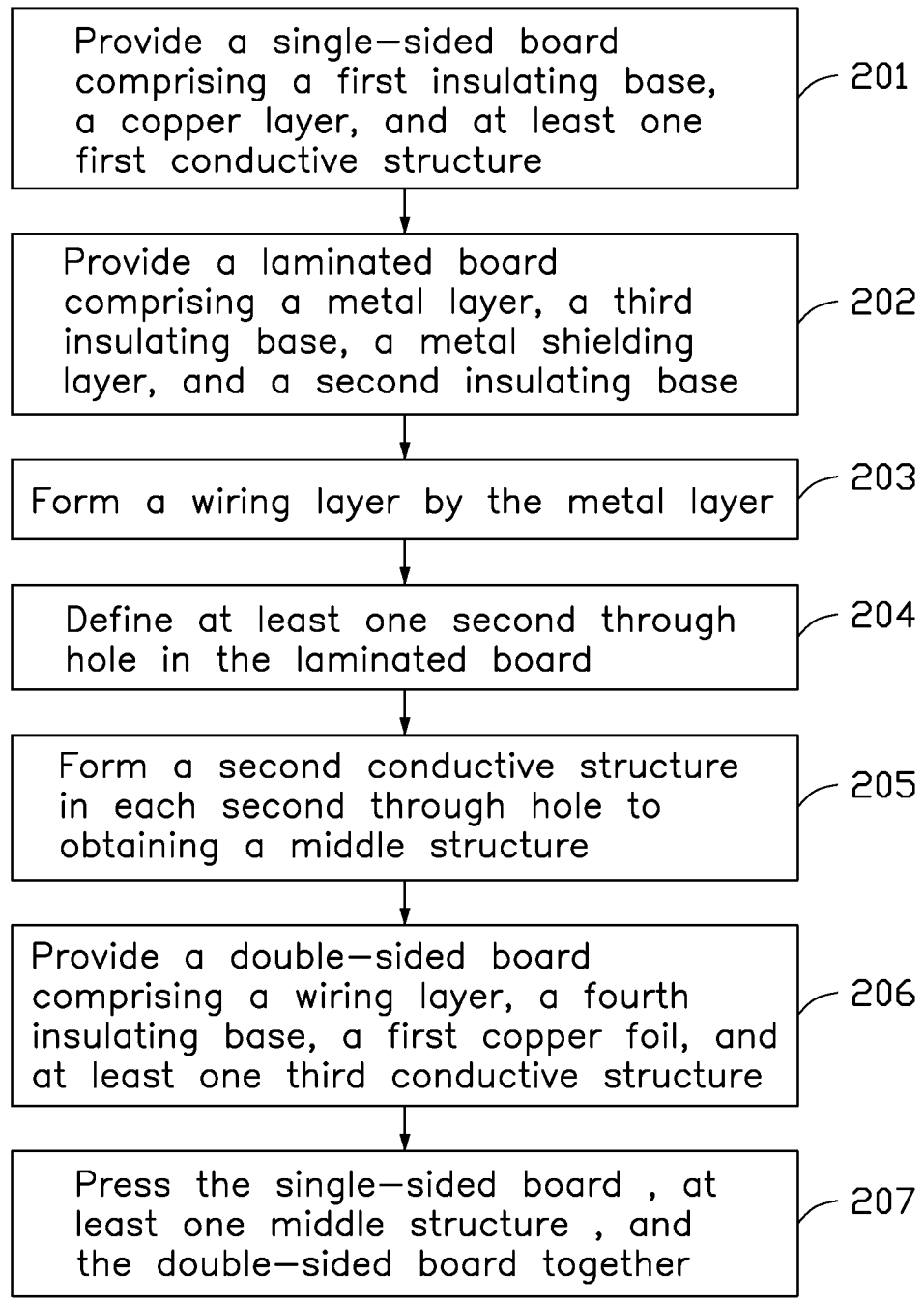
FIG. 1 is a flowchart of a first embodiment of a method for manufacturing a circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a flowchart of a method in accordance with a first embodiment. The method for manufacturing a circuit board 100a (shown in FIG. 8) is provided by way of embodiments, as there are a variety of ways to carry out the method. Each block shown in FIG. 1 represents one or more processes, methods, or subroutines carried out in the method. Furthermore, the illustrated order of blocks is by example only and the order of the blocks can be changed. Additional blocks may be added or fewer blocks may be utilized, without departing from this disclosure. The method can begin at block 201.

Figure 2:
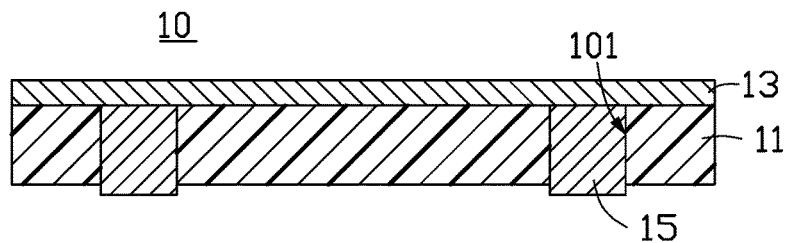
FIGS. 2-8 are cross-sectional views of illustrating respective steps of a first embodiment of a method for manufacturing the circuit board.

At block 201, referring to FIG. 2, a single-sided board 10 is provided. The single-sided board 10 comprises a first insulating base 11 and a copper layer 13 covering a surface of the first insulating base 11. At least one first through hole 101 is defined in the single-sided board 10. Each of the at least one first through hole 101 passes through the first insulating base 11 to expose the copper layer 13. The single-sided board 10 further comprises at least one first conductive structure 15 each fully infilled in the at least one first through hole 101.

Each of the at least one first conductive structure 15 may protrude from a surface of the first insulating base 11 facing away from the copper layer 13.

Figure 3:
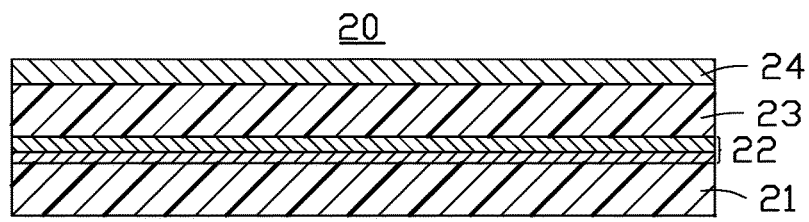

At block 202, referring to FIG. 3, a laminated board 20 is provided. The laminated board 20 comprises a metal layer 24, a third insulating base 23, a metal shielding layer 22, and a second insulating base 21 arranged in that sequence.

Figure 4:
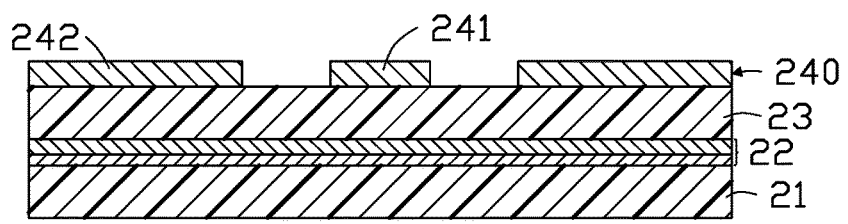

At block 203, referring to FIG. 4, a wiring layer 240 is formed by the metal layer 24 of the laminated board 20, and comprises at least one signal wire 241 and at least one connecting pad 242.

In at least one embodiment, the wiring layer 240 comprises a signal wire 241 and two connecting pads 242. The signal wire 241 is between the two connecting pads 242.

Figure 5:
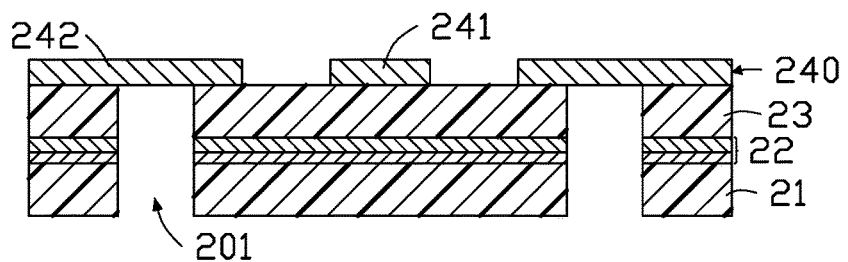

At block 204, referring to FIG. 5, at least one second through hole 201 is defined in the laminated board 20. Each of the at least one second through hole 201 passes through the second insulating base 21, the metal shielding layer 22, and the third insulating base 23 to expose one of the at least one connecting pad 242.

In at least one embodiment, the at least one second through hole 201 is defined by laser. In another embodiment, the at least one second through hole 201 may be defined by mechanical cutting or etching.

In another embodiment, each of the at least one second through hole 201 further passes through a portion of the corresponding connecting pad 242, thereby forming a hollow (not shown) in the corresponding connecting pad 242.

Figure 6:
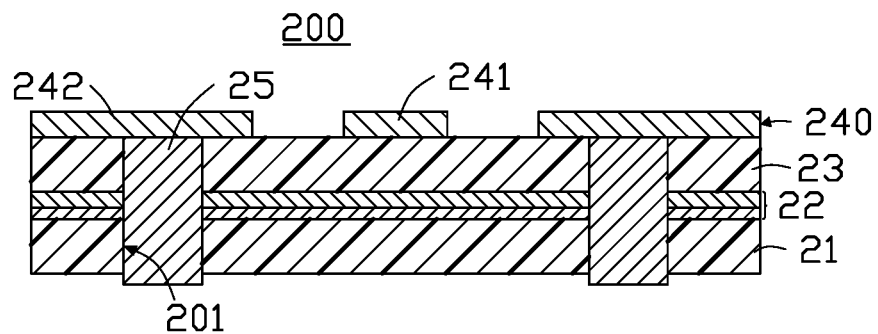

At block 205, referring to FIG. 6, a second conductive structure 25 is fully infilled in each of the at least one second through hole 201, thereby obtaining a middle structure 200.

In at least one embodiment, an end portion of the second conductive structure 25 connect the corresponding at least one connecting pad 242, and another end portion of the second conductive structure 25 protrudes from a surface of the second insulating base 21 facing away from the metal shielding layer 22.

In at least one embodiment, the second conductive structure 25 is formed by conductive paste filling each of the at least one second through hole 201. In another embodiment, the second conductive structure 25 may be made of other material, such as metal, and may be formed by other method, such as electroplating.

In another embodiment, the end portion of the second conductive structure 25 connecting the corresponding at least one connecting pad 242 can be embedded into the corresponding at least one connecting pad 242.

Figure 7:
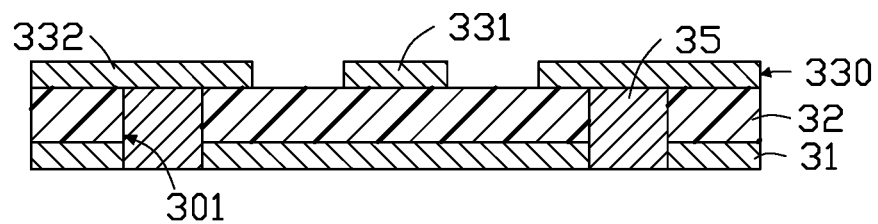

At block 206, referring to FIG. 7, a double-sided board 30 is provided. The double-sided board 30 comprises a wiring layer 330, a fourth insulating base 32, and a first copper foil 31 arranged in that sequence. The wiring layer 330 comprises at least one signal wire 331 and at least one connecting pad 332. The double-sided board 30 further comprises at least one third conductive structure 35 each passing through the fourth insulating base 32 and connecting one of the at least one connecting pad 332 and the first copper foil 31.

In at least one embodiment, the wire layer 330 comprises a signal wire 331 and two connecting pads 332. The signal wire 331 is between the two connecting pads 332.

Figure 8:
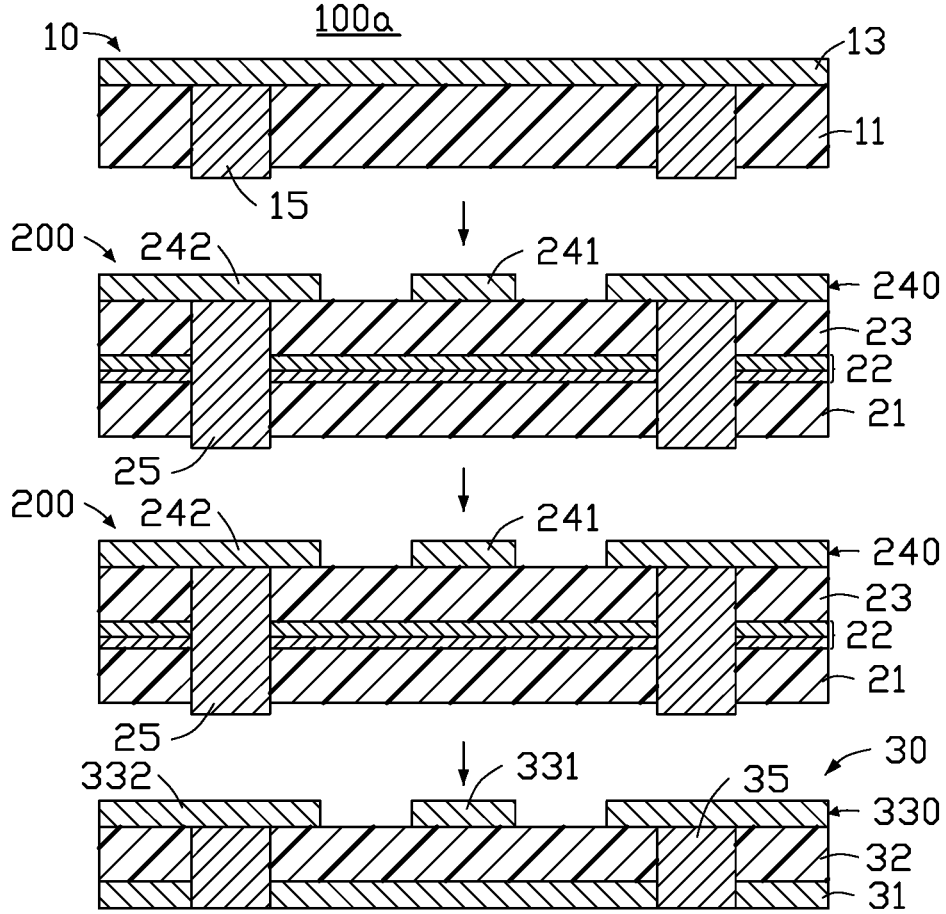

At block 207, referring to FIG. 8, the single-sided board 10, at least one middle structure 200, and the double-sided board 30 are pressed in that sequence to form the circuit board 100a. Each of the at least one first conductive structure 15 connects one of the at least one connecting pad 242 of the middle structure 200 adjacent to the single-sided board 10. Each of the at least one connecting pad 332 connects one of the at least one second conductive structure 25 of the middle structure 200 adjacent to the double-sided board 30. When the number of the at least one middle structure 200 is greater than one, each of the at least one second conductive structure 25 of one of the at least one middle structures 200 connects to another corresponding second conductive structure 25 through a corresponding at least one connecting pad 242 of a next one of the at least one middle structure 200.

In at least one embodiment, the number of the at least one middle structure 200 is two. In the circuit board 100a, from top to bottom, comprises one single-sided board 10, a first middle structure 200, a second middle structure 200, and the double-sided board 30. An end portion of each at least one first conductive structure 15 facing away from the copper layer 13 connects an end portion of a at least one connecting pad 242 of the first middle structure 200 facing away from the metal shielding layer 22 of the first middle structure 200. An end portion of each second conductive structure 25 of the first middle structure 200 facing away from the connecting pad 242 of the first middle structure 200 connects an end portion of a corresponding at least one connecting pad 242 of the second middle structure 200 facing away from the metal shielding layer 22 of the second middle structure 200. An end portion of each second conductive structure 25 of the second middle structure 200 facing away from the at least one connecting pad 242 of the second middle structure 200 connects an end portion of a corresponding at least one connecting pad 332 facing away from the first copper foil 31. The first insulating base 11 is combined with the third insulating base 23 of the first middle structure 200 to form a dielectric layer to wrap the wiring layer 240 of the first middle structure 200. The second insulating base 21 of the first middle structure 200 is combined with the third insulating base 23 of the second middle structure 200 to form a dielectric layer to wrap the wiring layer 240 of the second middle structure 200. The second insulating base 21 of the second middle structure 200 is combined with the fourth insulating base 32 to form a dielectric layer to wrap the wiring layer 330.

Each of the wiring layer is sandwiched between the copper layer 13 and one shielding layer 22, or between one first copper foil 31 and one shielding layer 22, or between two shielding layers 22. As a result, each of the wiring layer can be protected from electromagnetic interference.

Figure 9:
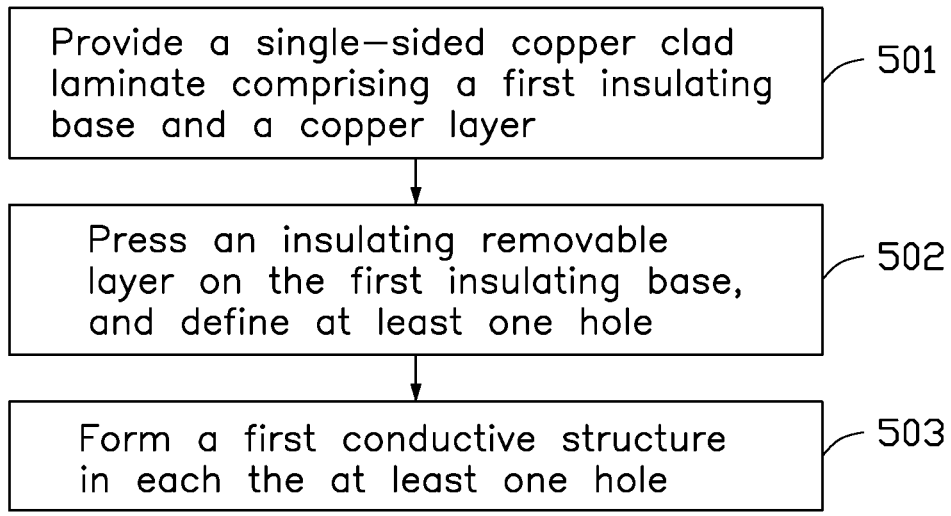
FIG. 9 is a flowchart of an embodiment of a method for manufacturing a single-sided board.

FIG. 9 illustrates a flowchart of an embodiment of a method for manufacturing the single-sided board 10. The method can begin at block 501.

Figure 10:
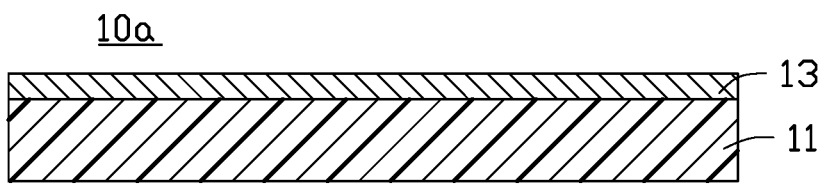
FIGS. 10-11 are cross-sectional views of illustrating respective steps of a method for manufacturing the single-sided board.

At block 501, referring to FIG. 10, a single-sided copper clad laminate 10a is provided. The single-sided copper clad laminate 10a comprises a first insulating base 11 and a copper layer 13 covering a surface of the first insulating base 11.

In at least one embodiment, the first insulating base 11 may be a dielectric material having a dielectric constant less than 3.4 and a dielectric dissipation factor less than 0.005, such as liquid crystalline polymer, polyetheretherketone, or modified polyimide. In another embodiment, the first insulating base 11 can be other dielectric material as needed.

Figure 11:
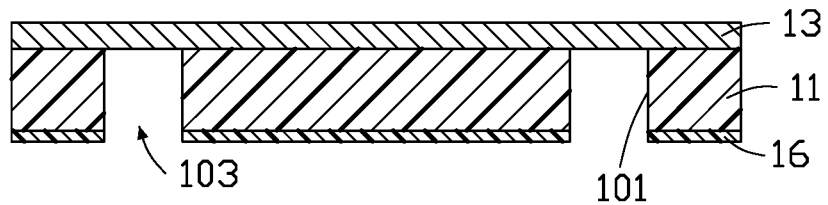

At block 502, referring to FIG. 11, an insulating removable layer 16 is pressed on a surface of the first insulating base 11 facing away from the copper layer 13. At least one hole 103 each passing through the insulating removable layer 16 and the first insulating base 11 is defined to expose the copper layer 13. Each of the at least one hole 103 comprises a first through hole 101 passing through the first insulating base 11.

At block 503, referring to FIG. 2, a first conductive structure 15 is formed in each of the at least one hole 103 to be fully infilled in the at least one hole 103, and the insulating removable layer 16 is removed, thereby obtaining the single-sided board 10. An end portion of the at least one first conductive structure 15 connects the copper layer 13, another end portion of the at least one first conductive structure 15 protrudes from a surface of the first insulating base 11 facing away from the copper layer 13.

In at least one embodiment, the at least one first conductive structure 15 is formed by conductive paste filling each of the at least one hole 103. In another embodiment, the at least one first conductive structure 15 may be formed by electroplating.

Figure 12:
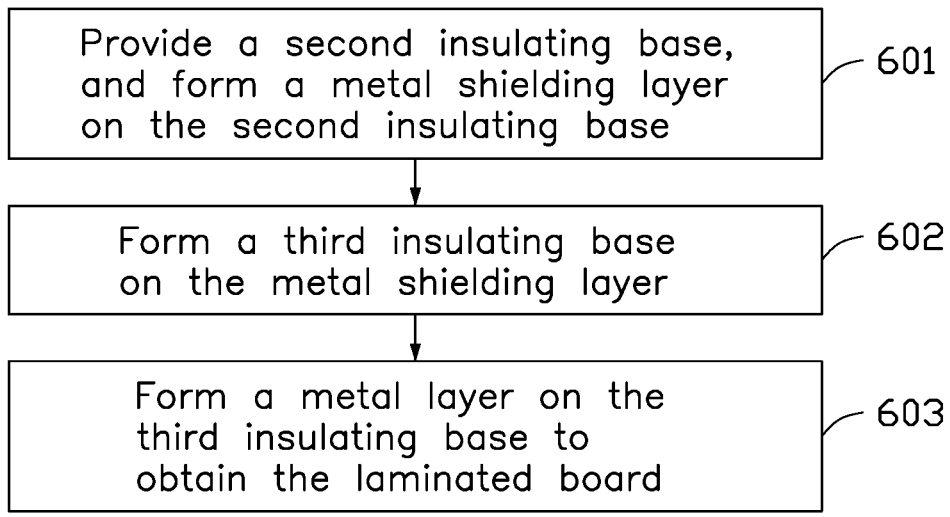
FIG. 12 is a flowchart of an embodiment of a method for manufacturing a laminated board.

FIG. 12 illustrates a flowchart of an embodiment of a method for manufacturing the laminated board 20. The method can begin at block 601.

Figure 13:
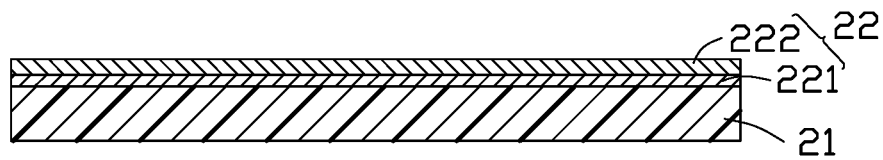
FIGS. 13-14 are cross-sectional views of illustrating respective steps of a method for manufacturing the laminated board.

At block 601, referring to FIG. 13, a second insulating base 21 is provided, and a metal shielding layer 22 is formed on a surface of the second insulating base 21.

In at least one embodiment, the surface of the second insulating base 21 is roughened, a seed layer 221 is formed on the roughened surface, and a metal thickening layer 222 is formed on a surface of the seed layer 221 facing away from the second insulating base 21. The metal shielding layer 22 is formed by the seed layer 221 and the metal thickening layer 222.

The seed layer 221 can be made by coating, electroplating, electroless plating, ion plating, or sputter coating. In at least one embodiment, the seed layer 221 is made by coating a composition on the roughened surface. The composition comprises an initiator, a monomeric compound, $CuBr_2$, sparteine, and silver powders. The initiator has a mass percentage of about 0.036% to about 1.36% of a total mass of the composition. The monomeric compound has a mass percentage of about 10% to about 20% of a total mass of the composition. CuBr$_2$ has a mass percentage of about 0.028% to about 0.28% of a total mass of the composition. Sparteine has a mass percentage of about 0.09% to about 0.9% of a total mass of the composition. Silver powders have a mass percentage of about 80% to about 90% of a total mass of the composition.

In at least one embodiment, the seed layer 221 has a thickness of about 0.1 μm to about 1 μm.

The metal thickening layer 222 may be made by electroplating or electroless plating.

Figure 14:
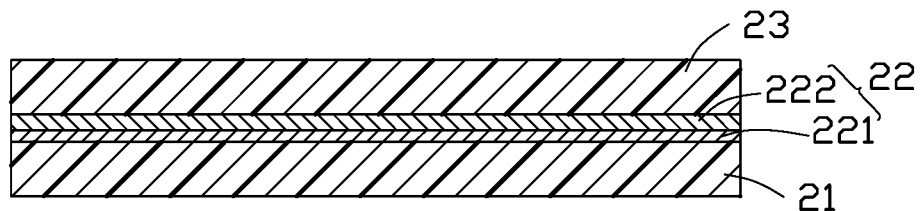

At block 602, referring to FIG. 14, a third insulating base 23 is formed on a surface of the metal shielding layer 22 facing away from the second insulating base 21.

The third insulating base 23 can be made by coating an insulating material on the metal shielding layer 22, and curing the insulating material. In another embodiment, the third insulating base 23 may be pressed on the metal shielding layer 22 directly.

In at least one embodiment, each of the second insulating base 21 and the third insulating base 23 may be a dielectric material having a dielectric constant less than 3.4 and a dielectric dissipation factor less than 0.005, such liquid crystalline polymer, polyetheretherketone, or modified polyimide.

At block 603, referring to FIG. 3, a metal layer 24 is formed on a surface of the third insulating base 23 facing away from the metal shielding layer 22, thereby obtaining the laminated board 20.

The metal layer 24 may be formed by metallization, or pressing a metal foil on the third insulating base 23.

Figure 15:
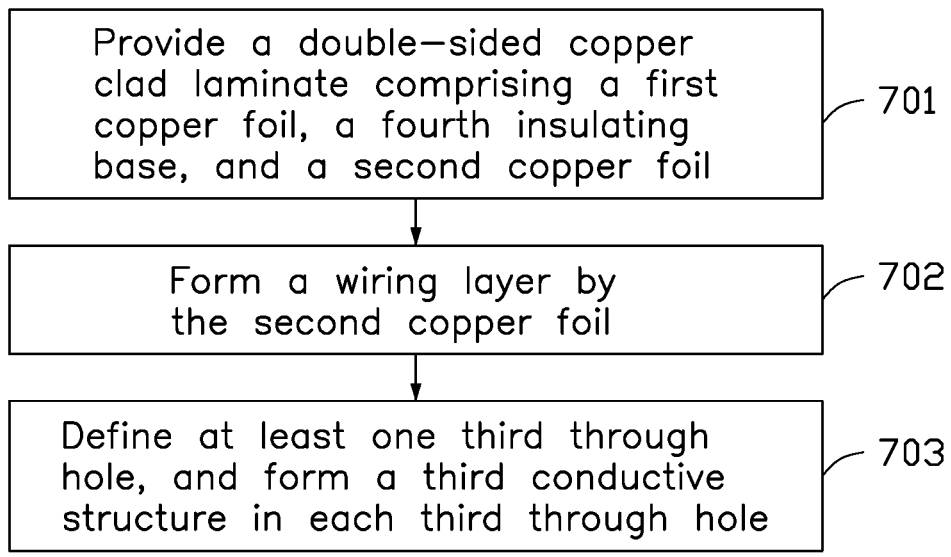
FIG. 15 is a flowchart of an embodiment of a method for manufacturing a double-sided board.

FIG. 15 illustrates a flowchart of an embodiment of a method for manufacturing the double-sided board 30. The method can begin at block 701.

Figure 16:
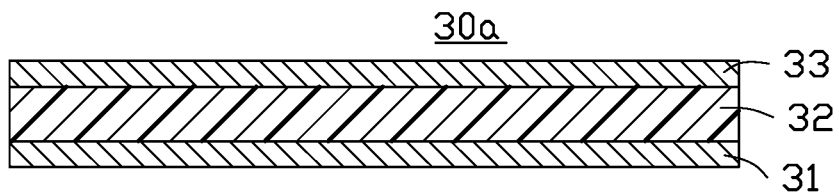
FIGS. 16-17 are cross-sectional views of illustrating respective steps of a method for manufacturing the double-sided board.

At block 701, referring to FIG. 16, a double-sided copper clad laminate 30a is provided. The double-sided copper clad laminate 30a comprises a first copper foil 31, a fourth insulating base 32, and a second copper foil 33 arranged in that sequence.

Figure 17:
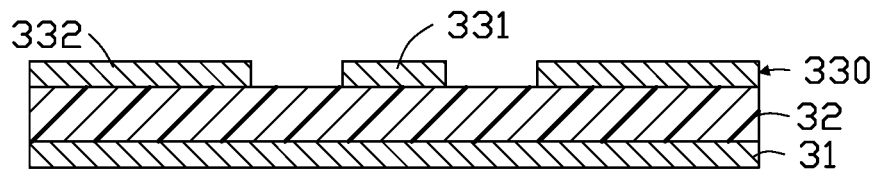

At block 702, referring to FIG. 17, a wiring layer 330 is formed by the second copper foil 33, and comprises at least one signal wire 331 and at least one connecting pad 332.

At block 703, referring to FIG. 7, at least one third through hole 301 passing through the fourth insulating base 32 is defined. The first copper foil 31 communicates with one of the at least one connecting pad 332 via the at least one third through hole 301. A third conductive structure 35 formed in each of the at least one third through hole 301 to connect the first copper foil 31 to one of the at least one connecting pad 332.

In at least one embodiment, each of the at least one third through hole 301 passes through the first copper foil 31 and the fourth insulating base 32 to expose one of the at least one connecting pad 332.

In another embodiment, each of the at least one third through hole 301 further passes through a portion of or an entire corresponding connecting pad 332, and the third conductive structure 35 is embedded into the corresponding connecting pad 332.

Figure 18:
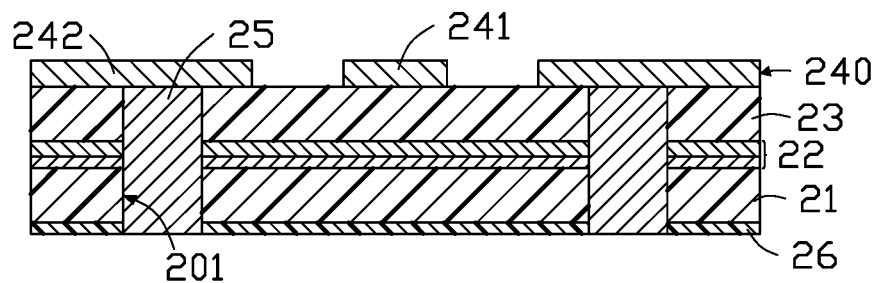
FIG. 18 is a cross-sectional view of an insulating removable layer applied to form a middle structure of FIG. 6.

In another embodiment, referring to FIGS. 18 and 6, an insulating removable layer 26 is pressed on a surface of the second insulating base 21 facing away from the metal shielding layer 22, and then the at least one second through hole 201 passing through the insulating removable layer 26, the second insulating base 21, the metal shielding layer 22, and the third insulating base 23 is defined to expose a corresponding at least one connecting pad 242. The insulating removable layer 26 is removed after forming the second conductive structure 25, to cause the second conductive structure 25 to protrude from a surface of the second insulating base 21 facing away from the metal shielding layer 22, as shown in FIG. 6.

Figure 19:
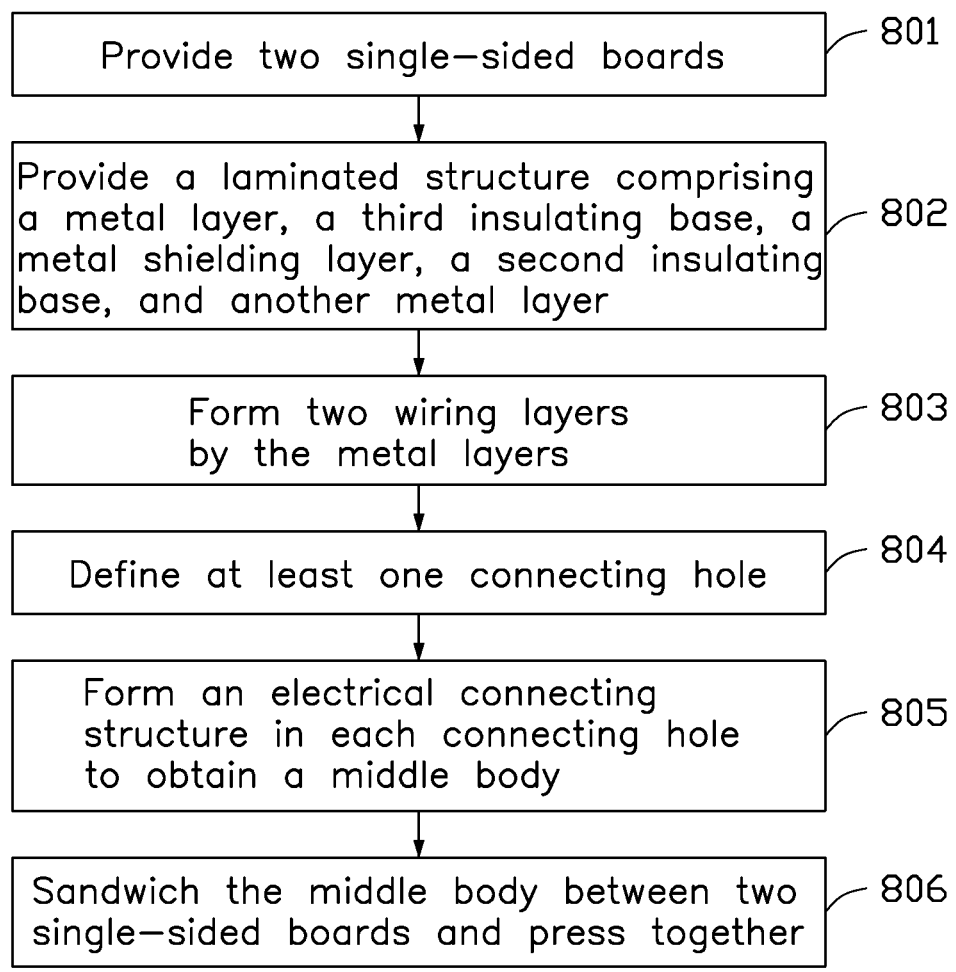
FIG. 19 is a flowchart of a second embodiment of a method for manufacturing a circuit board.

FIG. 19 illustrates a flowchart of a second embodiment of a method for manufacturing the circuit board 100b. The method can begin at block 801.

At block 801, two single-sided boards 10 as shown in FIG. 2 is provided.

Figure 20:
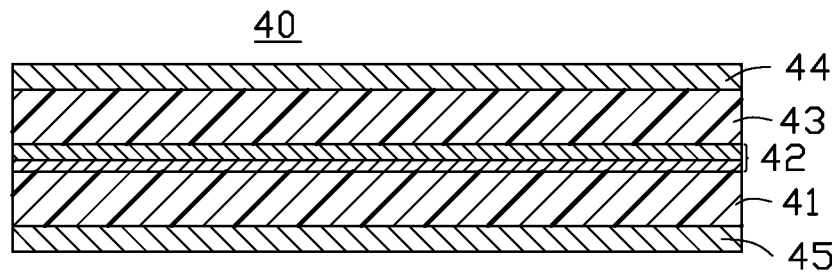
FIGS. 20-24 are cross-sectional views of illustrating respective steps of a second embodiment of a method for manufacturing the circuit board.

At block 802, referring to FIG. 20, a laminated structure 40 is provided. The laminated structure 40 comprises a metal layer 44, a third insulating base 43, a metal shielding layer 42, a second insulating base 41, and another metal layer 45.

In at least one embodiment, compared with the method of manufacturing the laminated board 20, a method of manufacturing the laminated structure 40 further comprises forming another metal layer 45 on a surface of the second insulating layer 41 facing away from the metal shielding layer 42.

The metal layer 45 may be formed by metallization, or pressing a metal foil on the second insulating base 41.

Figure 21:
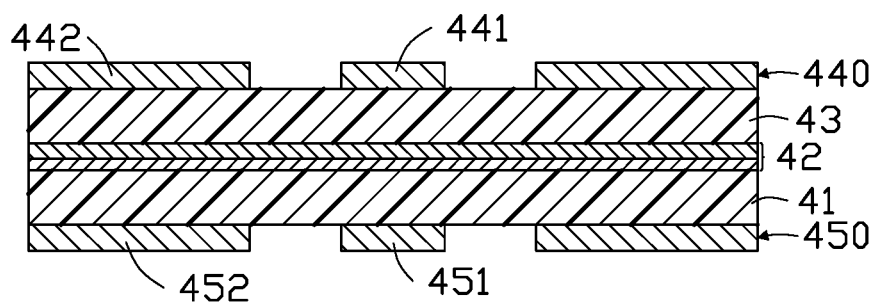

At block 803, referring to FIG. 21, a wiring layer 440 and a wiring layer 450 are formed by the metal layers 44 and 45 respectively. Each wiring layer 440, 450 comprises at least one signal wire 441, 451 respectively, and at least one connecting pad 442, 452, respectively.

Figure 22:
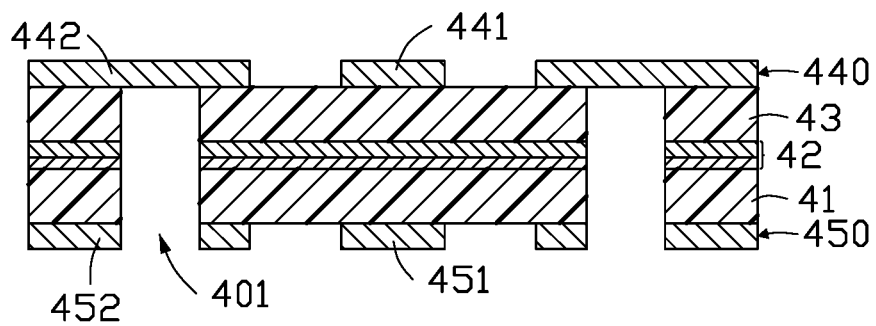

At block 804, referring to FIG. 22, at least one connecting hole 401 is defined. Each of the at least one connecting hole 401 passes through one connecting pad 452, the second insulating base 41, the metal shielding layer 42, and the third insulating base 43. Each of the at least one connecting pad 442 is communicated with a corresponding at least one connecting pad 452 through the connecting hole 401.

In at least one embodiment, each of the at least one connecting hole 401 just passes through one connecting pad 452, the second insulating base 41, the metal shielding layer 42, and the third insulating base 43.

Figure 23:
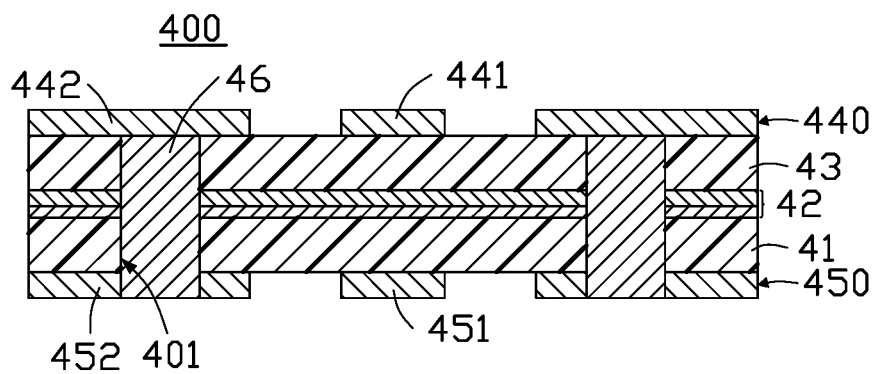

At block 805, referring to FIG. 23, an electrical connecting structure 46 is fully infilled in each of the at least one connecting hole 401, thereby obtaining a middle body 400. Each of the electrical connecting structure 46 connects the one of the at least one connecting pad 442 to a corresponding connecting pad 452.

The electrical connecting structure 46 is formed by conductive paste filling in each of the at least one connecting hole 401. In another embodiment, the electrical connecting structure 46 may be made of other material, such as metal, and may be formed by other method, such as electroplating.

Figure 24:
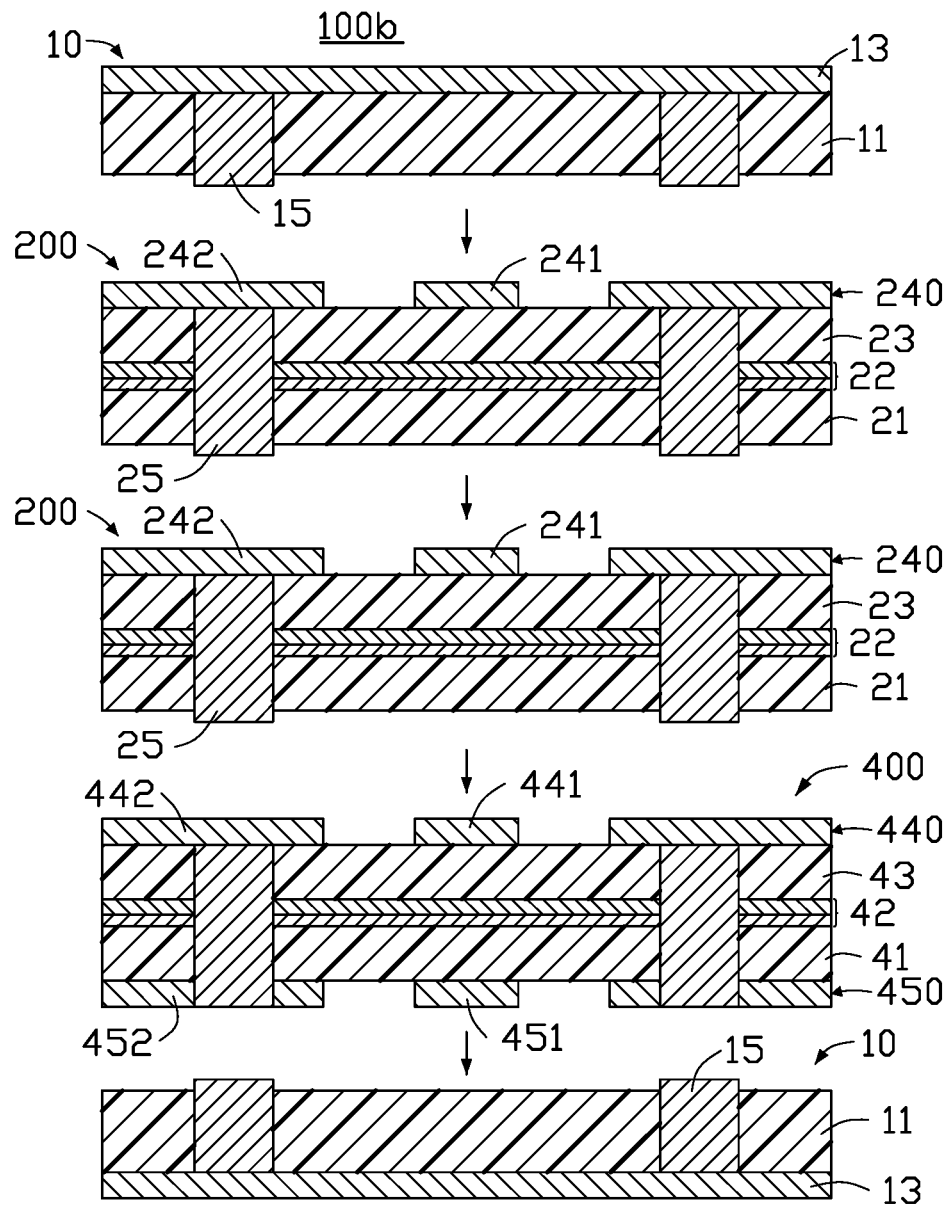

At block 806, referring to FIG. 24, the middle body 400 is sandwiched between two single-sided boards 10, and is pressed with two single-sided boards 10 to form the circuit board 100b. Each of the at least one connecting pad 442 and the at least one connecting pad 452 connects an end portion of one of the at least one first conductive structure 15 of two single-sided boards 10 facing away from the corresponding copper layer 13.

In at least one embodiment, at least one middle structure 200 may be between two single-sided boards 10 when pressing to form the circuit board 100b.

In the illustrated embodiment in FIG. 24, the number of the at least one middle structure 200 is two and the middle structures 200 are located in a same side of the middle body 400. In the circuit board 100b, from bottom to top, comprises a first single-sided board 10, a middle body 400, a first middle structure 200, a second middle structure 200, and a second single-sided board 10. The embodiment as shown in FIG. 24 differs from the first embodiment described above, an end portion of each second conductive structure 25 of the second middle structure 200 facing away from the at least one connecting pad 242 of the second middle structure 200 connects an end portion of one of the at least one connecting pad 442 facing away from the metal shielding layer 42. An end portion of each of the at least one connecting pad 452 facing away from the metal shielding layer 42 connects an end portion of one of the at least one first conductive structure 15 of the first single-sided board 10 facing away from the copper layer 13 of the first single-sided board 10.

Figure 25:
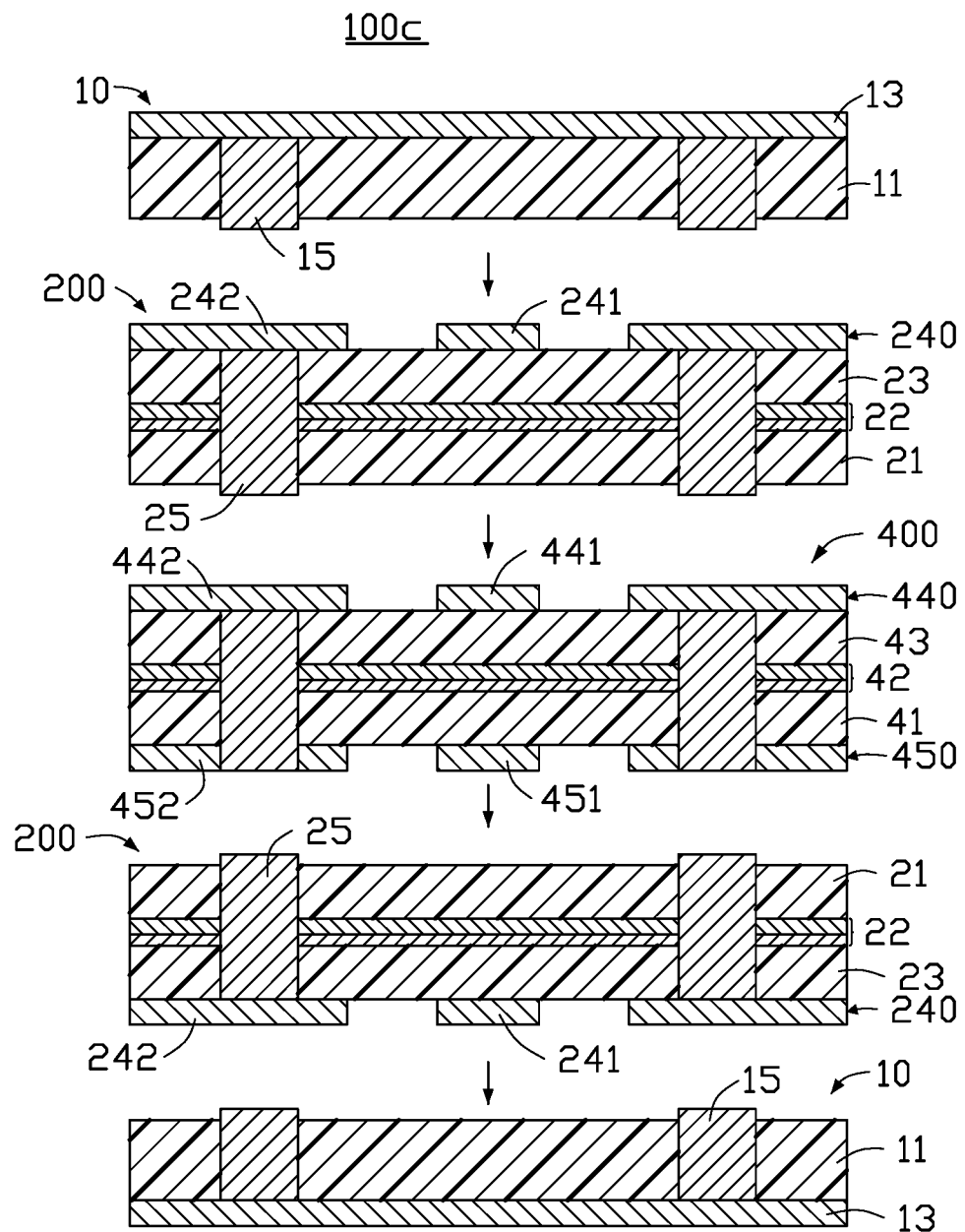
FIG. 25 is a cross-sectional view of another embodiment of a method for manufacturing the circuit board.

In another embodiment, referring to FIG. 25, the first middle structure 200 and the second middle structure 200 are located on the opposite side of the middle body 400 respectively. In a circuit board 100c, from top to bottom, comprises a first single-sided board 10, a first middle structure 200, a middle body 400, a second middle structure 200, and a second single-sided board 10. The embodiment as described in FIG. 25 differs from the first embodiment as described above, an end portion of each second conductive structure 25 of the first middle structure 200 facing away from the connecting pad 242 of the first middle structure 200 connects an end portion of one of the at least one connecting pad 442 facing away from the metal shielding layer 42. An end portion of each of the at least one connecting pad 452 facing away from the metal shielding layer 42 connects an end portion of each second conductive structure 25 of the second middle structure 200 facing away from the at least one connecting pad 242 of the second middle structure 200. An end portion of each of the at least one connecting pad 242 of the second middle structure 200 facing away from the metal shielding layer 22 of the second middle structure 200 connects an end portion of one of the at least one first conductive structure 15 of the second single-sided board 10 facing away from the copper layer 13 of the second single-sided board 10.

In another embodiment, the at least one connecting hole 401 may be passing through a portion of or an entire at least one connecting pad 442. The electrical connecting structure 46 is embedded in the at least one connecting pad 442.

The laminated board 20 comprises the metal layer 24 and the metal shielding layer 22, the laminated structure 40 comprises the metal layer 44, the metal shielding layer 42, and another metal layer 45. Then the wiring layer is formed by the metal layer, and the wiring layer electrically connects the metal shielding layer. That is, in the method for manufacturing the circuit board, the wiring layer is electrically connected to the metal shielding layer before pressing. As a result, the method can reduce an alignment tolerance when pressing.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Figure 26:
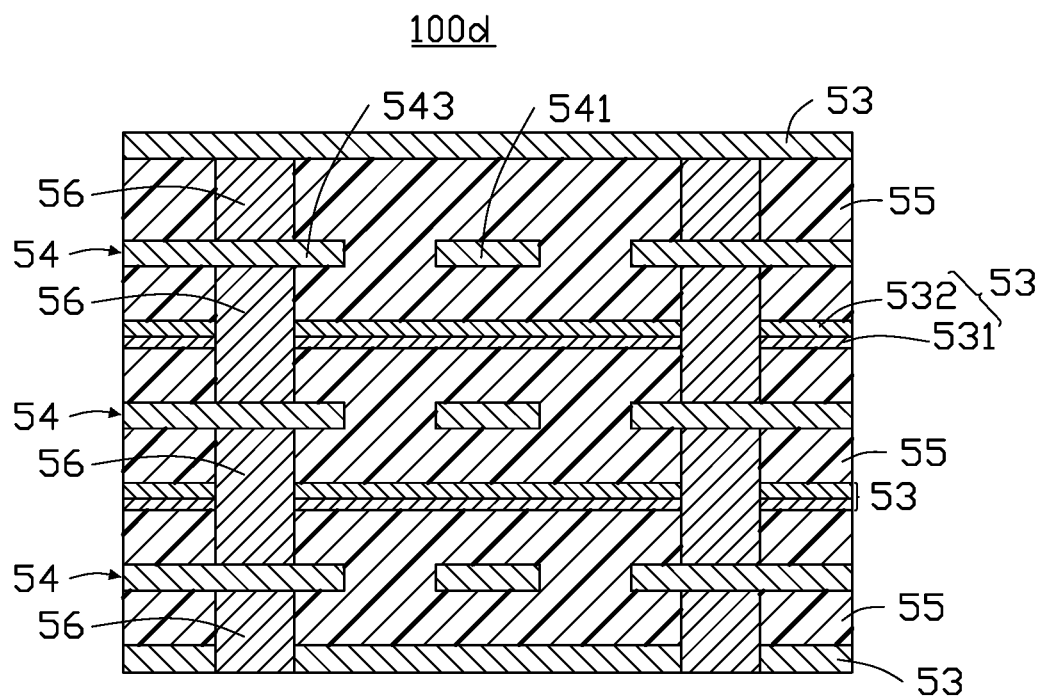
FIG. 26 is a cross-sectional view of an embodiment of a circuit board.

FIG. 26 illustrates an embodiment of a circuit board 100d. The circuit board 100d comprises N+1 number of the metal shielding layers 53, N number of the wiring layer(s) 54, and N number of the dielectric layer(s) 55, wherein N is a natural number. Each of the dielectric layer 55 is sandwiched between every two adjacent metal shielding layers 53, and surrounds one of the wiring layer 54. Each of the wiring layer 54 comprises at least one signal wire 541 and at least one connecting pad 543. Each of the at least one connecting pad 543 connects the adjacent metal shielding layers 53 by the conductive structure 56 embedded in the dielectric layer 55. Each of the metal shielding layers 53 surrounded by the dielectric layer 55 comprises the seed layer 531 and the metal thickening layer 532 formed on the seed layer 531.

The seed layer 531 has a thickness of about 0.1 μm to about 1 μm.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a circuit board comprising:
   providing a single-sided board comprising a first insulating base, a copper layer covering a surface of the first insulating base, at least one first through hole each passing through the first insulating base to expose the copper layer, and at least one first conductive structure each infilled in one of the at least one first through hole;
   forming at least one middle structure, each of the middle structure being formed by:
      providing a laminated board comprising a metal layer, a third insulating base, a metal shielding layer, and a second insulating base arranged in that sequence;
      forming a wiring layer by the metal layer, the wiring layer comprising at least one signal wire and at least one connecting pad;
      defining at least one second through hole each passing through the second insulating base, the metal shielding layer, and the third insulating base to expose one of the at least one connecting pad; and
      forming a second conductive structure infilled in each of the at least one second through hole, the second conductive structure protruding from a surface of the second insulating base facing away from the metal shielding layer;
   providing a double-sided board comprising a wiring layer, a fourth insulating base, and a first copper foil arranged in that sequence, the wiring layer of the double-sided board comprising at least one signal wire and at least one connecting pad, the double-sided board further comprising at least one third conductive structure each connecting one of the at least one connecting pad and the first copper foil; and
   pressing the single-sided board, the at least one middle structure, and the double-sided board in that sequence to form the circuit board;
   wherein each of the at least one first conductive structure connects one of the at least one connecting pad of an adjacent one of the middle structure, each of the at least one connecting pad of the double-sided board directly connects one second conductive structure of the adjacent middle structure; when the circuit board comprises at least two middle structures, the two adjacent middle structures connect with each other by directly connecting the second conductive structure of one of the middle structures with the corresponding connecting pad of the adjacent middle structure.

2. The method for manufacturing a circuit board of claim 1, wherein each of the wiring layer in the laminated board and in the double-sided board comprises at least one signal wire and at least two connecting pads, the at least one signal wire being located between the at least two connecting pads of each wiring layer.

3. A method for manufacturing a circuit board comprising:
providing a single-sided board comprising a first insulating base, a copper layer covering a surface of the first insulating base, at least one first through hole each passing through the first insulating base to expose the copper layer, and at least one first conductive structure each infilled in one of the at least one first through hole;
forming a middle body by:
    providing a laminated structure comprising a metal layer, a third insulating base, a metal shielding layer, a second insulating base, and another metal layer arranged in that sequence;
    forming a wiring layer by each of the metal layer and the other metal layer, each said wiring layer comprising at least one signal wire and at least one connecting pad;
    defining at least one connecting hole each passing through the connecting pad of the laminated structure, the second insulating base, the metal shielding layer, and the third insulating base, to communicate the two connecting pads of each of the two wiring layers of the laminated structure with each other; and
    forming an electrical connecting structure infilled in each of the at least one connecting hole;
providing a middle structure by:
    providing a laminated board comprising a metal layer, a third insulating base, a metal shielding layer, and a second insulating base arranged in that sequence;
    forming a wiring layer by the metal layer of the laminated board, the wiring layer of the laminated board comprising at least one signal wire and at least one connecting pad;
    pressing an insulating removable layer on a surface of the second insulating base facing away from the metal shielding layer;
    defining at least one second through hole each passing through the insulating removable layer, the second insulating base, the metal shielding layer, and the third insulating base of the laminated board to expose the at least one connecting pad of the laminated board;
    forming a second conductive structure infilled in each of the at least one second through hole of the laminated board, thereby obtaining the middle structure; and
    removing the insulating removable layer on the second insulating base, wherein the second conductive structure protrudes from a surface of the second insulating base facing away from the metal shielding layer;
pressing the single-sided board, at least one of the middle structure, the middle body, and another the single-sided board in that sequence to form the circuit board;
wherein the connecting pads of each of the two wiring layers of the middle body connect the at least one first conductive structure of one single-sided board and the second conductive structure of the middle structure, respectively.

4. The method for manufacturing a circuit board of claim 3, wherein the laminated board is made by the same way as the laminated structure.

5. The method for manufacturing a circuit board of claim 3, wherein at least one the middle structure is sandwiched between the middle body and one of the two single-sided boards.

6. The method for manufacturing a circuit board of claim 3, wherein at least one of the middle structures is sandwiched between the middle body and each of the two single-sided boards.

7. The method for manufacturing a circuit board of claim 3, wherein each wiring layer of the laminated structure and the laminated board comprises at least one signal wire and at least two connecting pads, the at least one signal wire of each wiring layer is located between the at least two connecting pads of each of the corresponding wiring layers.

* * * * *